(12) United States Patent
Toh

(10) Patent No.: US 6,747,870 B2
(45) Date of Patent: Jun. 8, 2004

(54) ELECTROMAGNETIC INTERFERENCE REDUCTION AIR DUCT

(75) Inventor: Tze-Chuen Toh, Vermillion, SD (US)

(73) Assignee: Gateway, Inc., Poway, CA (US)

( * ) Notice: Subject to any disclaimer, the term of this patent is extended or adjusted under 35 U.S.C. 154(b) by 0 days.

(21) Appl. No.: 10/131,913

(22) Filed: Apr. 25, 2002

(65) Prior Publication Data

US 2003/0202326 A1 Oct. 30, 2003

(51) Int. Cl.⁷ .............................................. H05K 7/20
(52) U.S. Cl. ................ 361/690; 174/35 R; 174/35 MS; 361/695; 361/818; 454/184
(58) Field of Search ............... 174/35 R, 35 GC, 174/35 MS; 361/690, 687, 694–695, 816, 818; 454/184; 333/12; 428/447, 209, 344, 349; 427/240, 247, 250

(56) References Cited

U.S. PATENT DOCUMENTS

| | | | |
|---|---|---|---|
| 5,030,793 A | 7/1991 | McCarthy | 174/35 |
| 5,175,613 A | 12/1992 | Barker, III et al. | 257/713 |
| 5,180,513 A | 1/1993 | Durand | 252/62.55 |
| 5,486,720 A | 1/1996 | Kierse | 257/659 |
| 5,706,170 A * | 1/1998 | Glovatsky et al. | 361/695 |
| 5,729,431 A | 3/1998 | Marwah et al. | 361/687 |
| 5,804,875 A | 9/1998 | Remsburg et al. | 257/718 |
| 5,814,761 A * | 9/1998 | Piazza | 174/35 R |
| 5,880,930 A | 3/1999 | Wheaton | 361/690 |
| 6,011,299 A | 1/2000 | Brench | 257/660 |
| 6,049,469 A | 4/2000 | Hood, III et al. | 361/818 |
| 6,061,235 A | 5/2000 | Cromwell et al. | 361/690 |
| 6,064,571 A | 5/2000 | Noble | 361/695 |
| 6,093,888 A | 7/2000 | Laureanti et al. | 174/35 R |
| 6,122,167 A | 9/2000 | Smith et al. | 361/687 |
| 6,130,818 A | 10/2000 | Severson | 361/690 |
| 6,167,949 B1 | 1/2001 | Langley et al. | 165/104.33 |
| 6,208,516 B1 | 3/2001 | Fangonilo et al. | 361/704 |
| 6,212,069 B1 | 4/2001 | Janik et al. | 361/687 |
| 6,219,239 B1 | 4/2001 | Mellberg et al. | 361/704 |
| 6,330,154 B1 * | 12/2001 | Fryers et al. | 361/695 |
| 6,384,325 B1 * | 5/2002 | Chastain et al. | 174/35 R |

OTHER PUBLICATIONS

US 2003/0030980 Bird et al "Electronics Cooling Subassembly" Feb. 13, 2003.*

"Fall '99 Intel Developer Forum Conference Notebook", (1999); p. 4.

* cited by examiner

Primary Examiner—Gregory D. Thompson
(74) Attorney, Agent, or Firm—Scott Charles Richardson; Bradley A. Forrest; Schwegman, Lundberg, Woessner & Kluth

(57) ABSTRACT

An air duct is provided for ventilating an electronic device having a processor. The air duct comprises one or more walls that have an irregular surface and that further have a layer of conductive material applied to the irregular surface. Further embodiments of the invention include electronic device enclosures and electronic devices having an air duct featuring an irregular interior surface and having conductive material applied to the irregular surface.

18 Claims, 2 Drawing Sheets

ELECTROMAGNETIC INTERFERENCE REDUCTION AIR DUCT

FIELD OF THE INVENTION

The invention relates generally to electromagnetic compatibility, and more specifically to an air duct designed to reduce electromagnetic radiation.

BACKGROUND OF THE INVENTION

Modern electronic devices that rely upon computerized circuits or digital logic typically conduct voltage signals within the circuits that change at very fast rates. Because digital logic is usually implemented in terms of ones and zeros, with ones being represented by some positive voltage such as 5 v or 3.3 v, and zeros being represented by zero voltage, such circuits must quickly change state from a positive voltage to zero voltage millions or billions of times per second to provide the capability to quickly calculate or process information.

These rapid changes in voltage state within such circuits can be viewed over time as approximating what is known as a square wave, wherein the voltage changes between states almost instantaneously. In practice, all circuits have limited bandwidth, and so a perfect square wave is not achieved. But, the approximate square wave that appears in most digital logic circuits changes state more quickly with faster circuits and switching times, and contains higher frequency components as it changes state more quickly.

These high frequency components can be easily radiated from a computerized device as electromagnetic fields from the electronic circuit, especially when the wavelength of the high frequency components is short enough to become a significant fraction of the conductive traces or wires that connect the circuit components to each other, which then become effective antennas. Digital signals are rich in spectral content, often containing significant energy over a wide bandwidth of the radio spectrum. These signals must be shielded to reduce emissions to certain levels before a digital electronic product can be sold according to requirements imposed by most countries, and so must be understood and controlled in the design process.

Unfortunately, modern computational devices also typically produce significant amounts of heat, and must be cooled. This is typically achieved by forced air ventilation, which requires that a physical hole exist between the digital circuitry and the outside air. Such a hole can allow electromagnetic radiation to escape in addition to the intended consequence of venting heat, and can become a serious design problem when electromagnetic emissions must be controlled.

What is desired is a system and method for reducing the electromagnetic emissions radiated from a digital electronic device through air ducts or passages.

SUMMARY OF THE INVENTION

The present invention provides an air duct for ventilating an electronic device having a processor. The air duct comprises one or more walls that have an irregular surface and that further have a layer of conductive material applied to the irregular surface. Further embodiments of the invention include electronic device enclosures and electronic devices having an air duct featuring an irregular interior surface and having conductive material applied to the irregular surface.

DETAILED DESCRIPTION

In the following detailed description of sample embodiments of the invention, reference is made to the accompanying drawings which form a part hereof, and in which is shown by way of illustration specific sample embodiments in which the invention may be practiced. These embodiments are described in sufficient detail to enable those skilled in the art to practice the invention, and it is to be understood that other embodiments may be utilized and that logical, mechanical, electrical, and other changes may be made without departing from the spirit or scope of the present invention. The following detailed description is, therefore, not to be taken in a limiting sense, and the scope of the invention is defined only by the appended claims.

The present invention provides an air duct for ventilating an electronic device having a processor. The air duct comprises one or more walls that have an irregular surface and that further have a layer of conductive material applied to the irregular surface. Further embodiments of the invention include electronic device enclosures and electronic devices having an air duct featuring an irregular interior surface and having conductive material applied to the irregular surface.

Figure 1:
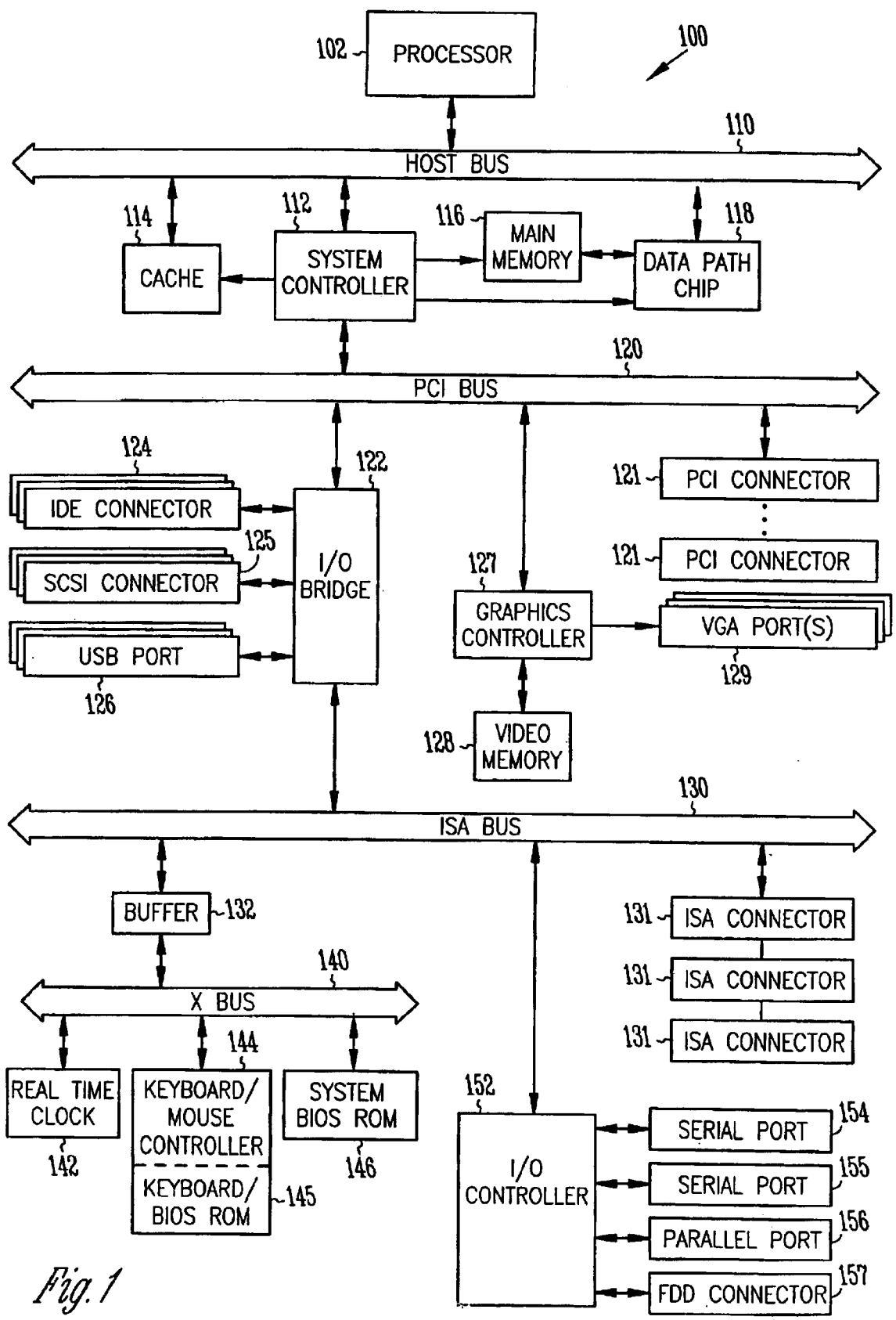
FIG. 1 shows a general purpose computer having a processor operating at a specific frequency, as may be used with an embodiment of the present invention.

FIG. 1 illustrates a general-purpose personal computer system 100, such as may be may be ventilated by an air duct or enclosed in an enclosure consistent with the present invention. In this embodiment, processor 102, system controller 112, cache 114, and data-path chip 118 are each coupled to host bus 110. Processor 102 is a microprocessor such as a 486-type chip, a Pentium®, Pentium II® or other suitable microprocessor, and operates at a specific frequency. The microprocessor in some embodiments of the invention has a heat sink physically attached to it to provide cooling. Cache 114 provides high-speed local-memory data (in one embodiment, for example, 512 kB of cache memory) for processor 102, and is controlled by system controller 112, which loads cache 114 with data that is expected to be used soon after the data is placed in cache 112. Main memory 116 is coupled between system controller 114 and data-path chip 118, and in one embodiment, provides random-access memory of between 16 MB and 128 MB or more of data. In one embodiment, main memory 116 is provided on SIMMs (Single In-line Memory Modules), while in another embodiment, main memory 116 is provided on DIMMs (Dual In-line Memory Modules) or newer memory technology such as rambus, each of which plugs into suitable sockets provided on a motherboard holding many of the other components shown in FIG. 1. Main memory 116 includes standard DRAM (Dynamic Random-Access Memory), EDO (Extended Data Out) DRAM, SDRAM (Synchronous DRAM), RDRAM (Rambus DRAM), or other suitable memory technology. System controller 112 controls PCI (Peripheral Component Interconnect) bus 120, a local bus for system 100 that provides a high-speed data path between processor 102 and various peripheral devices, such as graphics devices, storage drives, network cabling, etc. Data-path chip 118 is also controlled by system controller 112 to assist in routing data between main memory 116, host bus 110, and PCI bus 120.

In one embodiment, PCI bus 120 provides a 32-bit-wide data path that runs at 33 MHz. In another embodiment, PCI bus 120 provides a 64-bit-wide data path that runs at 33 MHz. In yet other embodiments, PCI bus 120 provides 32-bit-wide or 64-bit-wide data paths that runs at higher speeds. In one embodiment, PCI bus 120 provides connectivity to I/O bridge 122, graphics controller 127, and one or more PCI connectors 121 (i.e., sockets into which a card edge may be inserted), each of which accepts a standard PCI card. In one embodiment, I/O bridge 122 and graphics controller 127 are each integrated on the motherboard along with system controller 112, in order to avoid a board-connector-board signal-crossing interface and thus provide better speed and reliability. In the embodiment shown, graphics controller 127 is coupled to a video memory 128 (that includes memory such as DRAM, EDO DRAM, SDRAM, SGRAM or VRAM (Video Random-Access Memory)), and drives VGA (Video Graphics Adaptor) port 129. VGA port 129 can connect to industry-standard monitors such as VGA-type, SVGA (Super VGA)-type, XGA-type (eXtended Graphics Adaptor) or SXGA-type (Super XGA) display devices. Other input/output (I/O) cards having a PCI interface can be plugged into PCI connectors 121.

In one embodiment, I/O bridge 122 is a chip that provides connection and control to one or more independent IDE connectors 124–125, to a USB (Universal Serial Bus) port 126, and to ISA (Industry Standard Architecture) bus 130. In this embodiment, IDE connector 124 provides connectivity for up to two standard IDE-type devices such as hard disk drives, CDROM (Compact Disk-Read-Only Memory) drives, DVD (Digital Video Disk) drives, or TBU (Tape-Backup Unit) devices. In one similar embodiment, two IDE connectors 124 are provided, and each provide the EIDE (Enhanced IDE) architecture. In the embodiment shown, SCSI (Small Computer System Interface) connector 125 provides connectivity for up to seven or fifteen SCSI-type devices (depending on the version of SCSI supported by the embodiment). In one embodiment, I/O bridge 122 provides ISA bus 130 having one or more ISA connectors 131 (in one embodiment, three connectors are provided). In one embodiment, ISA bus 130 is coupled to I/O controller 152, which in turn provides connections to two serial ports 154 and 155, parallel port 156, and FDD (Floppy-Disk Drive) connector 157. In one embodiment, ISA bus 130 is connected to buffer 132, which is connected to X bus 140, which provides connections to real-time clock 142, keyboard/mouse controller 144 and keyboard BIOS ROM (Basic Input/Output System Read-Only Memory) 145, and to system BIOS ROM 146.

A PCMCIA card controller (also known as a PC Card controller or CardBus controller) 160 is in one embodiment connected to the PCI bus 120, and is operable to interface the computer 100 to various PCMCIA hardware cads that may be inserted into PCMCIA slots of the computer system. The PCMCIA slots may receive, for example, a wireless data communication card such as a Bluetooth system complaint communication card.

FIG. 1 shows one exemplary embodiment of a computer system that may be used with the present invention, however other configurations, such as varying bus structures and memory arrangements are specifically contemplated and are within the scope of the invention. The computerized system of FIG. 1 may also be implemented in various physical configurations, such as a desktop personal computer, as a server, or as a laptop computer system.

Figure 2:
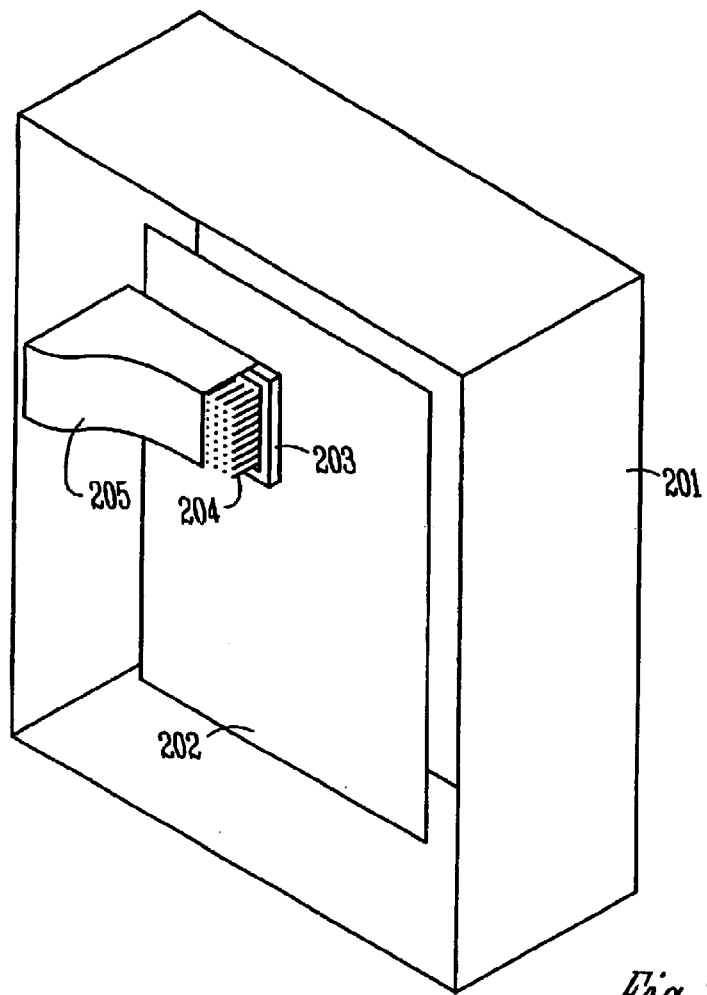
FIG. 2 illustrates a computerized system having an air duct providing ventilation for an enclosure, as may be used in an embodiment of the present invention.

FIG. 2 illustrates a computerized system having an air duct providing ventilation for an enclosure, consistent with an embodiment of the present invention. A computer system case or enclosure 201 contains and supports a motherboard 202. The motherboard is operatively connected to a microprocessor 203, which dissipates heat via attached heat sink 204. The heat sink 204 is further cooled by air directed to the heat sink via cooling duct 205.

When the computer system is in operation, the power dissipated by the microprocessor 203 can reach several tens of watts of power. This heat must be dissipated so that the microprocessor does not become so hot that it fails to function properly or suffers damage. The heat sink 204 is typically attached to the microprocessor with thermally conductive material, and is mounted securely into position. Heat is thereby transferred from the processor to the heat sink, which is specially configured to efficiently dissipate heat into the surrounding air.

The heat sink's effectiveness at heat dissipation is increased if air is forced to flow through the heat sink, and if the air surrounding or flowing through the heat sink is relatively cooler than the heat sink. Therefore, in some computerized systems, various air ducts 205 are contained within the computerized system to provide cool air to the processor heat sink and other system components. The air duct 205 of the example computerized system shown here is configured to bring air from the back of the computer to the heat sink 204, and in some embodiments includes a fan mounted within the duct to force cool air from outside the enclosure into the enclosure and across the heat sink.

Figure 3:
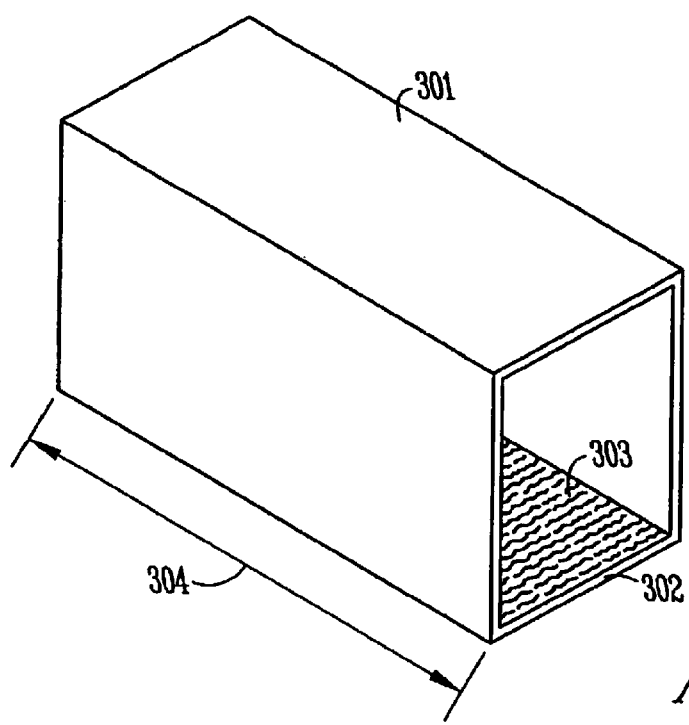
FIG. 3 illustrates an air duct, consistent with an embodiment of the present invention.

FIG. 3 illustrates one example air duct of the present invention that is configured to reduce electromagnetic emissions form the computerized system. The air duct 301 is made of a nonconductive material 302 such as plastic, and has an irregular interior surface 303. The irregular interior surface in one embodiment of the invention is irregular with respect to an electromagnetic radiation frequency emitted by the processor 203 and heat sink 204. In a still further embodiment, the irregularities on the interior surface of the air duct are at least $\frac{1}{20}$ the wavelength of the emitted electromagnetic radiation frequency.

The irregular surface 303 in one embodiment of the invention is a regular pattern, such as an array of pyramid-shaped bumps. In other embodiments, the bumps are random, form other patterns, are spherical in shape, are four-sided pyramidal, or take any other form causing the interior surface of the air duct to be irregular and have a greater surface area. The irregularities may be molded or formed as a part of the air duct 301, may be applied to the air duct 301 after it is formed, or may be created in any other manner consistent with the present invention as claimed.

The irregular interior surface 303 is then coated with a thin layer of conductive material, such as with metallic paint. It is desired that the interior surface of the duct be coated with material that has high conductivity, and in one embodiment of the invention that has a thickness of between one and two skin depths with respect to an electromagnetic radiation frequency emitted by the processor 203 and heat sink 204 that is to be attenuated. In a still further embodiment of the invention, the duct has a length 304 longer than the longest dimension of the heat sink 204 attached to the processor 203 and a length shorter than half the speed of propagation of light in a vacuum divided by the frequency of the signal to be attenuated.

The air-duct of the present invention is constructed in one embodiment of the invention such that it satisfies the following conditions:

1. The length l of the duct is bounded by $l_0 < l \leq l_1$, where $l_0$ is the maximal linear dimension of the CPU heatsink. In particular, $l_0$ is at least as long as the length of the heat-sink, and $l_1=c/2f_0$. Here, c is the speed of light in vacuum (to good approximation), and $f_0$ is typically chosen to be 1 GHz or greater where possible.

2. The interior walls of the air-duct should be designed with a uniform non-smooth pattern—e.g., small pyramidal bumps—in order to maximise the surface area of the interior of the air-duct.

3. A very thin coating of highly conductive paint in the interior of the air-duct, e.g., a metallic paint such as aluminum. The thickness $r_0$ of the paint is desired to satisfy $\delta<r_0\leq2\delta$, where $\delta$ is the skin-depth of the conductive paint, and the conductivity $\sigma$ of the paint is desirably of the order of $10^6$ to $10^7$ $\Omega^{-1}$ $m^{-1}$.

The thin coating of conductive paint in the interior of the air-duct accomplishes two primary objectives:

(a) it transforms part of the energy of the electromagnetic radiation into ohmic heat loss (and hence the requirement of condition (2) stipulated above);

(b) it causes an exponential attenuation of radiation as the waves pass through the conductive paint and along the parallel wave-guide, should the CPU frequency be less than the cut-off frequency $f_0$ of the wave-guide. The conductive paint converts the air-duct into a parallel wave-guide.

In one example embodiment of the invention, the operating CPU frequency is 1 GHz. Then, taking $f_0=3$ GHz (as the wave-guide cut-off frequency) implies that $l_1=5$ cm. Hence, choose $l\approx5$ cm, where l is the length of the air-duct defined in (1) above. Because the CPU frequency is less than the cut-off frequency of the duct by construction, it follows immediately that the radiation emitted by the CPU/heat-sink complex is attenuated exponentially in two ways. First, as the waves pass through the conductive material (paint), and second, as the waves propagate along the wave-guide (duct).

If the CPU frequency is greater than the cut-off frequency of the wave-guide, the thin coating of conductive paint makes the wave-guide a very lossy wave-guide, where the attenuation will arise primarily though the waves transmitted through the conductive paint. And because the CPU frequency is greater than the cut-off frequency of the wave-guide, the waves will propagate along the duct without suffering any exponential attenuation (aside from the exponential loss transmitted through the walls of the duct described above).

As another example, consider the case where the CPU frequency f is greater than the cut-off frequency $f_0$ of the air-duct, where $f_0=1$ GHz. Suppose also that the conductivity $\sigma$ of the paint is $3\times10^7$ $\Omega^{-1}$ $m^{-1}$. Then, the skin-depth of the conductive paint is $\delta\approx3$ $\mu m=0.003$ mm. If, in the absence of the conductive paint, the radiation escaping out of the chassis exceeds the maximal allowable electric field strength $E_0$ by 10 dB at 10 m, that is, the emitted field strength $E=\sqrt{10}E_0$ at 10 m, then, in order to reduce the emitted radiation down to the reference field strength $E_0$, the thickness $r_0$ of the conductive paint must satisfy $e^{-r_0/\delta}=1/\sqrt{10}$. That is, $$r_0 = \frac{1}{2}\delta\ln 10 \approx 1.2\delta.$$

This follows directly from $dB=10\log(E^2/E_0^2)$. Hence, a coating of thickness $r_0\approx0.004$ mm will cause the measured electric field strength E to fall below $E_0$ at 10 m after passing through the conductive paint.

By coating the interior of the duct walls with a very thin layer of highly conductive material, the radiation transmitted through the walls is attenuated exponentially that depends on the thickness of the conductive material. Should the conductive material be too thick, the duct becomes essentially a conductor and very little radiation is transmitted through it. However, the duct will now act as a (parallel) wave-guide for the electromagnetic radiation. This has the potential of forcing the guided (or resonant) energy into the power supply, causing the radiation to escape through the power cables.

On the other hand, by coating the walls very thinly with a conductive paint, the duct will now act as a very lossy wave-guide. In particular, the radiation energy guided into the power supply will be much weaker compared to the former case. Furthermore, should the electromagnetic frequency be less than the cut-off frequency of the wave-guide, propagation along the wave-guide will also cause exponential attenuation that is dependent upon the length of the guide. In the section below, a realistic model will be constructed, demonstrating quantitatively the validity of the theory out-lined above and elsewhere.

For example, at a CPU frequency of 1 GHz, the radiated power within the chassis (and hence, outside of the chassis) resulting from coating the duct 8 cm in length and 5 cm in width with a very thin conductive paint can be reduced below −6.22 dB. The details of the theoretical mode are explained in the model developed below.

In this model, it may be supposed without any loss of generality that 80% of the total electromagnetic energy at the CPU (fundamental) frequency f is radiated from the heat sink. The remaining 20% of the energy is radiated along power cables and so forth. Let $P_0$ denote the total radiated power at the CPU frequency f. Now, suppose that the air duct is coated with a conductive paint of thickness $r_0$ with conductivity $\sigma$, where $r_0$ satisfies $\delta<r_0\leq2\delta$, and $$\delta \approx \frac{1}{\sqrt{\pi\mu\sigma f}}$$

(for good conductors) denotes the skin-depth of the conductive paint. Here, for simplicity, it may be assumed that the permeability $\mu$ of the conductive paint is that of vacuum to good approximation.

In this example, the walls of the duct will assumed to be smooth. The case where the walls of the duct are granulated (in order to increase the overall surface area of the interior walls) will be commented at the end of the section. Let the length of the duct be $x_0$ and the distance between the two perpendicular walls of the duct (the width of the duct) be $y_0$. For simplicity of computation, assume, without any loss of generality, that the waves are sinusoidal, propagating along the length of the duct. That is, the electric field E is of the form $E=E_0e^{i(\omega t-\beta x)}$, where x is parallel to the length of the duct.

After solving Maxwell's equations with appropriate boundary conditions, it can be shown that $$\beta = \sqrt{\left(\frac{\omega}{c}\right)^2 - \left(\frac{m\pi}{y_0}\right)^2}, \quad (1.1)$$

where $\omega=2\pi f$ and $m=1, 2, \ldots$, are the various resonant modes induced by the wave-guide. From equation (1.1), it is clear that when $$\left(\frac{\omega}{c}\right)^2 - \left(\frac{m\pi}{y_0}\right)^2 < 0, \quad \beta \to i|\beta|$$

and the electric field E is thus attenuated exponentially as it travels along the wave-guide: $E=E_0 e^{i(\omega t-\beta x)} \to E_0 e^{-|\beta x|}e^{i\omega t}$. Hence, $\beta=0$ determines the cut-off frequency for the wave-guide for various resonant modes.

For convenience, the mode m=1 will only be considered here. Hence, the cut-off frequency is $$f_0 = \frac{c}{2y_0}.$$

That is, waves propagating along the length of the duct will be attenuated exponentially by $e^{-|\beta x|}$ if the frequency is less than the cut-off frequency. That is, the (radiated) power $P_1$ propagating along the guide a distance x will be attenuated by $$P_1 \to P_1 e^{-2|\beta x|}. \tag{1.2}$$

Furthermore, the electromagnetic field transmitted through the walls of the duct will be attenuated by a factor of $e^{-r_0/\delta}$. Hence, the power $P_2$ transmitted through the walls in the presence of a conductive paint will fall off by:

$$P_2 \to P_2 e^{-2r_0/\delta}, \tag{1.3}$$

where the total radiated power $P_0$ is $P_0=P_1+P_2$. Note in passing that for non-ideal conductors—that is, one with a finite conductivity—a surface current is generated, giving rise to ohmic heat loss. In other words, $P_0=P_1+P_2+P_{loss}$, where $P_{loss}$ is the heat generated by the surface currents on the conductive paint (induced by passing electromagnetic fields). This fact will be ignored in this analysis for simplicity: the subject will be broached at the end of this section for completeness.

Hence, the total power attenuated by the conductive air-duct is $$\tilde{P}=P_0(a_1 e^{-2|\beta x|}+a_2 e^{-2r_0/\delta}), \tag{1.4}$$

where $a_1+a_2=1$, for some $a_1, a_2>0$. By assuming that the source of the radiation to be situated at the center of the duct, the distance traveled by the waves along the duct is then $$x \to \frac{1}{2}x_0.$$

That is, $P=P_0(a_1 e^{-|\beta x_0|}+a_2 e^{-2r_0/\delta})$.

Now, by definition, the loss in power resulting from the attenuation of the conductive duct, measured in decibels, is given by $$dB = 10\log\frac{P}{P_0} = 10\log\left(\frac{E}{E_0}\right)^2, \tag{1.5}$$

where $P(P_0)$ is the attenuated (unattenuated) radiated power, and likewise, $E(E_0)$ is the attenuated (unattenuated) electric field strength.

Thus, measuring the power loss (that is, the attenuated power resulting from the conductive duct) within the chassis in terms of decibels is an easy matter, via equation (1.5). Indeed, the upper and lower bounds for dB can be easily determined, yielding the best and worst case attenuation scenario afforded by the conductive duct.

EXAMPLE 1 consider the case where $e^{-|\beta x_0|}>e^{-2r_0/\delta}$. Invoking equation (1.5) yields the following inequality:

$$-\frac{10}{\ln 10}\frac{2r_0}{\delta} \leq dB \leq -\frac{10}{\ln 10}|\beta x_0|. \tag{1.6}$$

Case 2: consider the case where $e^{-|\beta x_0|}<e^{-2r_0/\delta}$. Here, $$-\frac{10}{\ln 10}\frac{2r_0}{\delta} \geq dB \geq -\frac{10}{\ln 10}|\beta x_0|. \tag{1.7}$$

For concreteness, suppose that the CPU frequency f=1 GHz (so, the wavelength $\lambda$=0.3 m), $x_0$=8 cm and $y_0$=5 cm. Suppose also that the coating of conductive paint is of thickness $$r_0 = \frac{3}{2}\delta.$$

Then, considering only the first resonant mode m=1, from equation (1.1), $\beta \approx 62$ m$^{-1}$. Under this situation, case 2 applies and hence, from equation (1.7), it follows immediately that the power attenuated in terms of decibels is bounded by $$21.7 \leq dB \leq -13. \tag{1.8}$$

Hence, 80% of the total electromagnetic energy at 1 GHz is attenuated by at least 13 dB within the chassis simply by coating the inner walls of the air-duct with a conductive paint of thickness $$r_0 = \frac{3}{2}\delta.$$

In particular, from (1.5), 80% of the electric field is attenuated by at least 13 dB within the chassis, and hence, the electric fields propagating out of apertures on the chassis or cables coming out of the chassis will be attenuated by the corresponding amount also.

Now, the total radiated power at 1 GHz is $P=0.2P_0+0.8\tilde{P}$. Hence, from equation (1.5), the total radiated power attenuated in decibels can likewise be determined. This will be carried out below. First, observe that $$\ln\frac{\tilde{P}}{P_0} = \frac{\ln 10}{10}dB \Rightarrow \frac{\tilde{P}}{P_0} - e^{\frac{\ln 10}{10}dB} \approx e^{-3}.$$

Whence, $$\ln\frac{P}{P_0} = \ln(0.2+0.8e^{-3}) \approx 1.43.$$

This means that the total power attenuated within the chassis in decibels $dB_{total}$ is $$dB_{total} = \frac{10}{\ln 10}\ln\frac{P}{P_0} = -6.22.$$

Therefore, at worst (here, meaning the least power loss), the total power within the chassis as a result of coating the duct with a conductive paint, will drop by −6.22 dB. This is a significant drop in power radiated. In particular, the radiation power loss will be even greater due to ohmic (heat) loss arising from surface currents.

The power absorbed per unit area by an imperfect conductor (i.e., one whose conductivity is not infinite) is given by $$\frac{dP_{loss}}{dS} = \frac{\mu\omega\delta}{4}|H_\|\|^2, \quad (1.9)$$

where $H_\|$ is the magnetic field strength tangent to the outside surface of the conductor, and S is the surface area of the conductor. Hence, by increasing the inner surface area of the conductor by giving it a uniform granularity, the power loss resulting from heat loss can be made even greater. This contributes to the overall reduction in radiated power from the heat sink and CPU. Recall that in the derivation of result (1.7), the ohmic heat loss was not taken into consideration.

As a last remark, the choice of conductive material is important from the results derived above. Choosing a very poor conductive material will result in added thickness to the conductive coating on the inner walls of the air-duct. This will add to the cost of the air-duct. Choosing a highly conductive paint, on the other hand, will result in a very thin layer of coating. A paint having a conductivity of $3 \times 10^7 \, \Omega^{-1} \, m^{-1}$ has a skin-depth of $\delta \approx 0.003$ mm at 1 GHz. Hence, in the above example, the thickness needed to achieve a minimum attenuation (within the chassis) of −6.22 dB for 1 GHz is $r_0 \approx 0.0045$ mm.

The invention as described herein and as recited in the appended claims provides an improvement over traditional air ducts in that it is designed to reduce the intensity of electromagnetic signals at a particular frequency that travel through the air duct. It is anticipated that the present invention will ease the burden of meeting electromagnetic emission requirements for various types of computing devices, and will reduce electromagnetic interference in other devices near a system utilizing the air duct or enclosure of the present invention. The present invention achieves this in a way that is inexpensive and easy to implement relative to other measures often used to reduce electromagnetic interference or emissions, and therefore provides a desirable way to reduce the electromagnetic emissions that radiate through an air duct in a computerized system.

Although specific embodiments have been illustrated and described herein, it will be appreciated by those of ordinary skill in the art that any arrangement which is calculated to achieve the same purpose maybe substituted for the specific embodiments shown. This application is intended to cover any adaptations or variations of the invention. It is intended that this invention be limited only by the claims, and the full scope of equivalents thereof.

What is claimed is:

1. An air duct for ventilating an electronic device having a processor and for attenuating a signal, comprising:
   one or more walls forming an air duct, the one or more walls further having an irregular interior surface, wherein the irregular interior surface comprises bumps selected from a group consisting of pyramidal bumps and spherical bumps, the irregular interior surface of the duct further being irregular with respect to the wavelength of a signal to be attenuated; and
   a layer of conductive material applied to the irregular surface.

2. The air duct of claim 1, the duct having a length longer than the longest dimension of a heat sink attached to the processor and a length shorter than half the speed of propagation of light in a vacuum divided by the frequency of the signal to be attenuated.

3. The air duct of claim 1, wherein the interior surface of the duct comprises irregularities having at least one dimension that is one-twentieth or greater the wavelength of a signal to be attenuated.

4. The air duct of claim 1, wherein the irregular interior surface of the duct comprises a plurality of irregularities arranged in a uniform pattern.

5. The air duct of claim 1, wherein the layer of conductive material applied to the irregular interior surface is between one skin depth and two skin depths in thickness at the frequency to be attenuated.

6. An enclosure for an electronic device having a processor, the enclosure having an air duct for ventilation and for attenuation of a signal, the air duct comprising:
   one or more walls forming an air duct, the one or more walls further having an irregular interior surface, wherein the irregular interior surface comprises bumps selected from a group consisting of pyramidal bumps and spherical bumps, the irregular interior surface of the duct further being irregular with respect to the wavelength of a signal to be attenuated; and
   a layer of conductive material applied to the irregular surface.

7. The enclosure of claim 6, the duct having a length longer than the longest dimension of a heat sink attached to the processor and a length shorter than half the speed of propagation of light in a vacuum divided by the frequency of the signal to be attenuated.

8. The enclosure of claim 6, wherein the interior surface of the duct comprises irregularities having at least one dimension that is one-twentieth or greater the wavelength of a signal to be attenuated.

9. The enclosure of claim 6, wherein the irregular interior surface of the duct comprises a plurality of irregularities arranged in a uniform pattern.

10. The enclosure of claim 6, wherein the layer of conductive material applied to the irregular interior surface is between one skin depth and two skin depths in thickness at the frequency to be attenuated.

11. An electronic device having a processor and an enclosure, the enclosure having an air duct for ventilation, the air duct comprising:
    one or more walls forming an air duct, the one or more walls further having an irregular interior surface, wherein the irregular interior surface comprises bumps selected from a group consisting of pyramidal bumps and spherical bumps, the irregular interior surface of the duct further being irregular with respect to the wavelength of a signal to be attenuated; and
    a layer of conductive material applied to the irregular surface.

12. The electronic device of claim 11, the duct having a length longer than the longest dimension of a heat sink attached to the processor and a length shorter than half the speed of propagation of light in a vacuum divided by the frequency of the signal to be attenuated.

13. The electronic device of claim 11, wherein the interior surface of the duct comprises irregularities having at least one dimension that is one-twentieth or greater the wavelength of a signal to be attenuated.

14. The electronic device of claim 11, wherein the irregular interior surface of the duct comprises a plurality of irregularities arranged in a uniform pattern.

15. The electronic device of claim 11, wherein the layer of conductive material applied to the irregular interior surface is between one skin depth and two skin depths in thickness at the frequency to be attenuated.

16. An air duct for ventilating an electronic device having a processor and for attenuating a signal, comprising:

one or more walls forming an air duct, the one or more walls further having a granulated interior surface; and a layer of conductive material applied to the granulated interior surface.

17. An electronic device having a processor and an enclosure, the enclosure having an air duct for ventilation, the air duct comprising:

one or more walls forming an air duct, the one or more walls further having a granulated interior surface; and a layer of conductive material applied to the granulated interior surface.

18. The electronic device of claim 17 wherein the granulated interior surface is selected to optimize the surface area of the duct.

* * * * *